(12) United States Patent
Wu et al.

(10) Patent No.: US 9,117,828 B2
(45) Date of Patent: Aug. 25, 2015

(54) METHOD OF HANDLING A THIN WAFER

(75) Inventors: Weng-Jin Wu, Hsinchu (TW); Ku-Feng Yang, Dali (TW); Wen-Chih Chiou, Toufen (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 562 days.

(21) Appl. No.: 12/717,573

(22) Filed: Mar. 4, 2010

(65) Prior Publication Data

US 2010/0248427 A1 Sep. 30, 2010

Related U.S. Application Data

(60) Provisional application No. 61/164,112, filed on Mar. 27, 2009.

(51) Int. Cl.
| | |
|---|---|
| H01L 21/50 | (2006.01) |
| H01L 21/56 | (2006.01) |
| H01L 21/71 | (2006.01) |
| H01L 21/60 | (2006.01) |
| H01L 21/683 | (2006.01) |
| H01L 21/768 | (2006.01) |
| H01L 23/31 | (2006.01) |
| H01L 23/00 | (2006.01) |
| H01L 25/00 | (2006.01) |
| H01L 29/06 | (2006.01) |

(52) U.S. Cl.
CPC .......... *H01L 21/561* (2013.01); *H01L 21/6835* (2013.01); *H01L 21/76898* (2013.01); *H01L 23/3121* (2013.01); *H01L 24/11* (2013.01); *H01L 24/13* (2013.01); *H01L 24/81* (2013.01); *H01L 24/94* (2013.01); *H01L 24/95* (2013.01); *H01L 25/50* (2013.01); *H01L 29/0657* (2013.01); *H01L 24/16* (2013.01); *H01L 2221/68318* (2013.01); *H01L 2221/68345* (2013.01); *H01L 2224/131* (2013.01); *H01L 2224/13009* (2013.01); *H01L 2224/13099* (2013.01); *H01L 2224/13147* (2013.01); *H01L 2224/81001* (2013.01); *H01L 2224/81801* (2013.01); *H01L 2224/81894* (2013.01); *H01L 2224/83894* (2013.01); *H01L 2225/06513* (2013.01); *H01L 2225/06541* (2013.01); *H01L 2924/0001* (2013.01); *H01L 2924/014* (2013.01); *H01L 2924/01013* (2013.01); *H01L 2924/01029* (2013.01); *H01L 2924/01033* (2013.01); *H01L 2924/01074* (2013.01); *H01L 2924/09701* (2013.01); *H01L 2924/19041* (2013.01); *H01L 2924/19043* (2013.01)

(58) Field of Classification Search
USPC ......... 438/106, 108, 110, 127, 459, 464, 637, 438/667
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |

(Continued)

*Primary Examiner* — Seahvosh Nikmanesh
(74) *Attorney, Agent, or Firm* — Lowe Hauptman & Ham, LLP

(57) ABSTRACT

A method of handling a thin wafer includes forming a support structure at the edge of a thinned wafer that is encapsulated by a protection layer. The support structure can be an adhesive layer enclosing the protection layer, a dielectric-filled trench embedded in the thinned wafer and surrounding the protection layer, or a housing affixing the edge of the thinned wafer.

20 Claims, 17 Drawing Sheets

(56) References Cited

U.S. PATENT DOCUMENTS

| | | | |
|---|---|---|---|
| 5,380,681 | A | 1/1995 | Hsu |
| 5,481,133 | A | 1/1996 | Hsu |
| 6,002,177 | A | 12/1999 | Gaynes et al. |
| 6,153,536 | A * | 11/2000 | Brouillette et al. ............ 438/758 |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,333,206 | B1 * | 12/2001 | Ito et al. ........................ 438/106 |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,353 | B2 * | 1/2007 | Farnworth et al. ............ 438/462 |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,834,450 | B2 | 11/2010 | Kang |
| 7,973,407 | B2 * | 7/2011 | Ramanathan et al. ........ 257/737 |
| 2005/0064681 | A1 * | 3/2005 | Wood et al. ................... 438/459 |
| 2006/0219351 | A1 * | 10/2006 | Kuan et al. .................... 156/247 |
| 2008/0268614 | A1 * | 10/2008 | Yang et al. .................... 438/455 |
| 2009/0001598 | A1 * | 1/2009 | Chiou et al. ................... 257/777 |

* cited by examiner

METHOD OF HANDLING A THIN WAFER

RELATED APPLICATIONS

The present application is based on, and claims priority from, U.S. Provisional Application No. 61/164,112, filed Mar. 27, 2009, the disclosure of which is hereby incorporated by reference herein in its entirety.

TECHNICAL FIELD

The present invention relates to the fabrication of semiconductor devices, and more particularly, to a method of handling a thin wafer during the fabrication of semiconductor devices.

BACKGROUND

Semiconductor industry has experienced continued rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area. Three-dimensional (3D) integrated circuits (ICs) are therefore created to resolve the limitations of the number and length of interconnections between devices as the number of devices increases. Dies-to-wafer stack bonding is one method for forming 3D ICs, wherein one or more die is bonded to a wafer, and the size of dies may be smaller than the size of chips on the wafer. In order to reduce the thickness of semiconductor packages, increase the chip speed, and for high-density fabrication, efforts to reduce the thickness of a semiconductor wafer are in progress. Thickness reduction is performed by so-called backside grinding of a semiconductor wafer on the surface opposite that containing pattern-formed circuitry, on which a carrier is typically attached to support wafer handling. Because the thinned wafer tends to have insufficient strength and is more susceptible to deformation such as bending and/or warping, a surface of the wafer is then encapsulated in a molding compound (e.g., thermo-curing epoxy resin), prior to the wafer being separated into individual chip packages using a dicing process. However, in the course of removing the wafer provided with a rear side metallization from the carrier and subsequent further processing, mechanical damage could then easily occur, such as wafer fracture or edges being knocked off. Traditional molding process leaves 2-3 mm of the wafer edge for supporting, but the wafer edge will be exposed after releasing the carrier from the thinned wafer, causing the wafer to be more susceptible to cracking, chipping, and/or corrosive environmental influences during the subsequent dicing process and associated handling. For these reasons and other reasons that will become apparent upon reading the following detailed description, there is a need for a method of handling a thinned wafer to avoid the shortcomings of the conventional molding process.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, cross-sectional diagrams of FIGS. 1A to 1G illustrate an exemplary embodiment of an edge sealing method for handling a thin wafer.

Figure 1A:
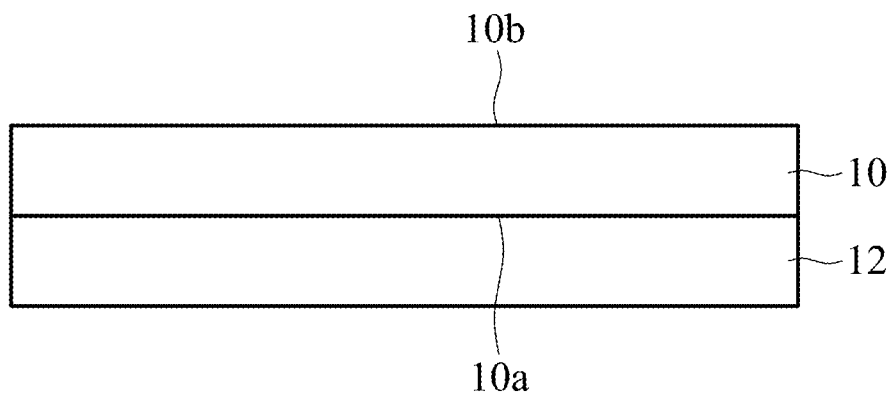
FIGS. 1A to 1G are cross-sectional diagrams illustrating an exemplary embodiment of an edge sealing method for handling a thin wafer.

FIG. 1A is a cross-sectional view of one embodiment of a wafer 10 attached to a carrier 12 through an adhesive layer. A wafer 10 is provided with a plurality of semiconductor chips therein. The wafer 10 includes a semiconductor substrate such as silicon, gallium arsenide, a rock crystal wafer, sapphire, glass, and the like. The wafer 10 has a first surface 10a and a second surface 10b opposite to the first surface 10a. On the first surface 10a, integrated circuits including active and passive devices such as transistors, resistors, capacitors and the like, are formed to connect bond pads and/or other interconnection structures. An adhesive layer is applied on the first surface 10a, and then a carrier 12 is bonded to the adhesive layer for enabling easier handling of the wafer 10 in subsequent processes. While doing so, the carrier 12 can be alternatively or cumulatively equipped with a corresponding adhesive surface. The carrier 12 is made of removable or dissolvable material such as glass, metal, ceramics, polymer, silicon, etc.

Figure 2A:
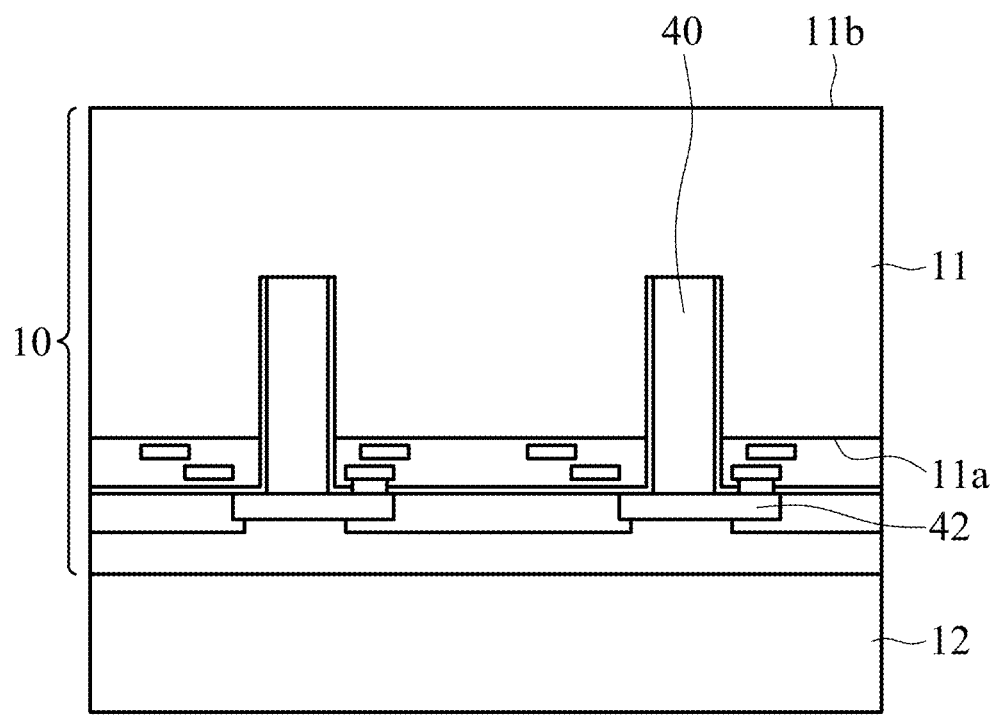
FIGS. 2A to 2C are cross-sectional diagrams illustrating an exemplary embodiment of a method for handling a wafer including through vias.

In an exemplary embodiment, the wafer 10 includes a plurality of through silicon vias (TSVs) used for 3D ICs applications. As shown in FIG. 2A, a wafer 10 comprises a semiconductor substrate 11 having a front surface 11a and a back surface 11b, wherein integrated circuits and interconnect structures are formed on the front surface 11a, and a plurality of through vias 40 passing through at least a part of the semiconductor substrate 11. The through via 40 is a metal-filled plug extending from the front surface 11a toward the back surface 11b and reaching an intended depth. The through via 40 can electrically connect a bond pad 42 formed on the interconnect structure. The fabrication of the through vias 40 is performed before the fabrication of "first-level interconnection" which refers to a lowermost metal layer patterned in a lowermost inter-metal dielectric (IMD) layer overlying contact structures and transistors. Alternatively, the metal-filled via process is performed after the fabrication of interconnect structures.

Figure 1B:
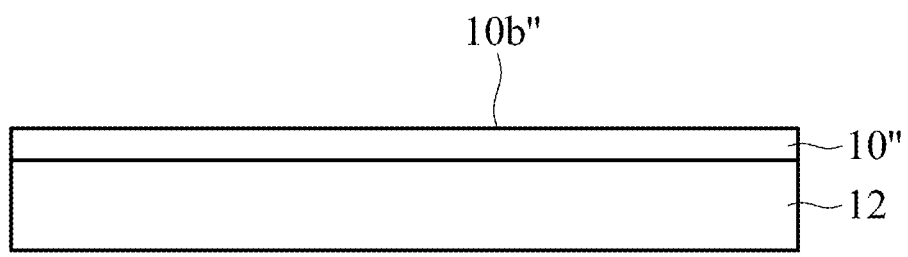
Figure 2B:
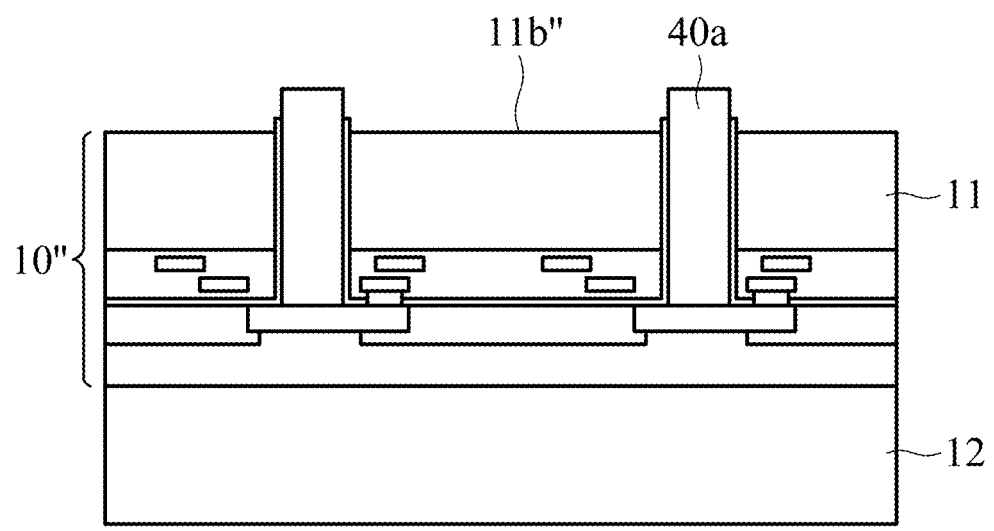

FIG. 1B is a cross-sectional view of the wafer 10 undergoing a wafer thinning process. After being attached to the carrier 12, the wafer 10 can now be processed in its structure-free area (second surface 10*b*) to the desired final thickness. This can be done, for example, through grinding, etching, and/or polishing, resulting in a thinned wafer 10" with a predetermined thickness depending on the purpose for which the semiconductor package is used. In one embodiment, the wafer 10 is thinned to a thickness of from about 5 μm to about 50 μm. In another embodiment, the wafer 10 is thinned to a thickness of from about 50 μm to about 180 μm. In the exemplary embodiment of providing the wafer 10 including the through via 40, one end 40*a* of the through via 40 is exposed and/or protruded from the back surface 11*b"* of the semiconductor substrate 11 after the wafer thinning process as shown in FIG. 2B.

Figure 1C:
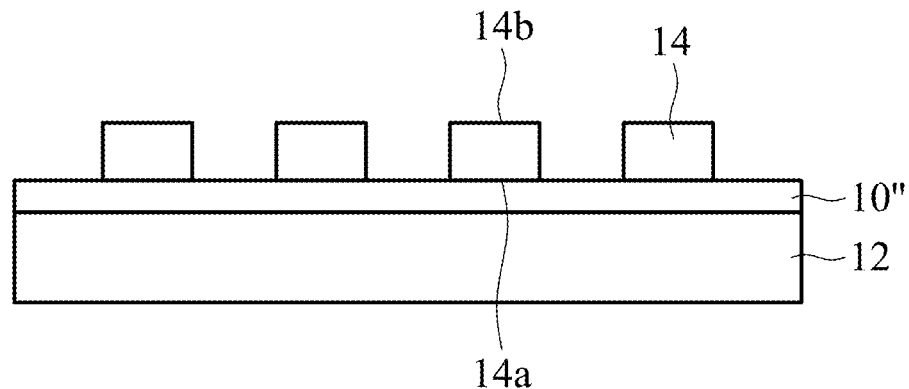
Figure 2C:
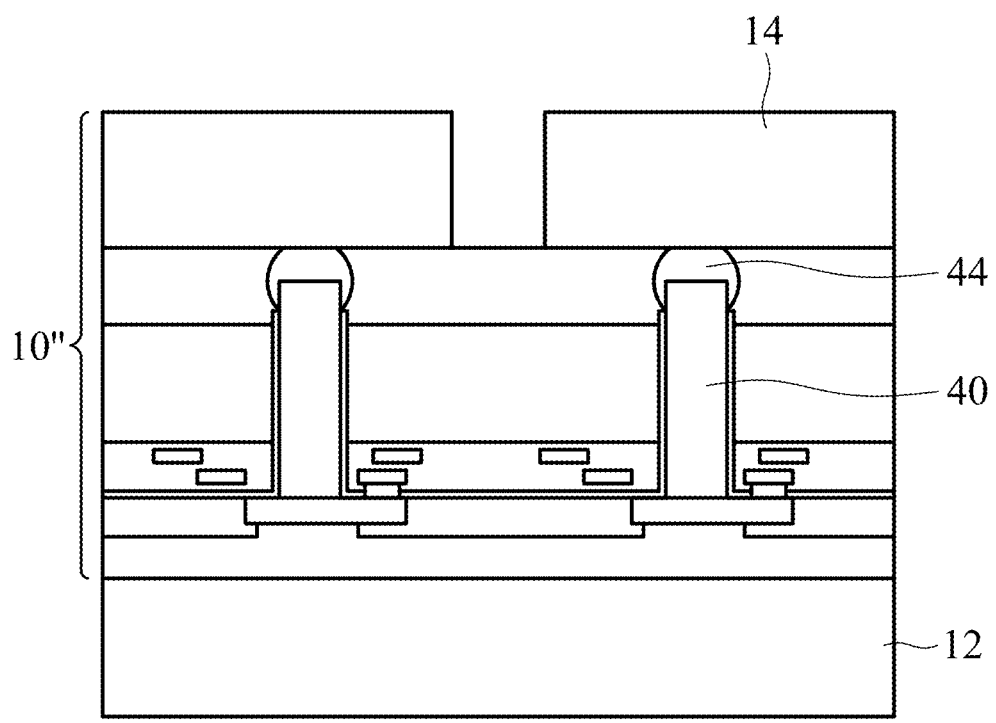

FIG. 1C is a cross-sectional view of a plurality of dies 14 bonded onto the thinned wafer 10", forming a dies-to-wafer stack. Backside metallization, including electrical connections and/or other structures, are formed on the exposed surface 10*b"* of the thinned wafer 10". Then, dies 14 are bonded onto the thinned wafer 10", wherein the bonding methods include commonly used methods such as oxide-to-oxide bonding, oxide-to-silicon bonding, copper-to-copper bonding, adhesive bonding, and the like. The dies 14 may include memory chips, RF (radio frequency) chips, logic chips, or other chips. Each of the dies 14 has a first surface 14*a* and a second surface 14*b*, and integrated circuits are formed on the first surface 14*a*. In one embodiment, the first surface 14*a* of the die 14 is bonded on the exposed surface 10*b"* of the thinned wafer 10". In one embodiment, the second surface 14*b* of the die 14 is bonded on the exposed surface 10*b"* of the thinned wafer 10". In the exemplary embodiment of providing the wafer 10 including the through via 40, conductive structures 44 such as solder bumps are formed on the exposed ends 40*a* of the through vias 40 to bond to the second surface 14*b* or the first surface 14*a* of the die 14 as shown in FIG. 2C. The conductive structures 44 also include redistribution layers and pads which can be formed on the exposed surface 10*b"* of the thinned wafer 10" before forming the solder bumps.

Figure 1D:
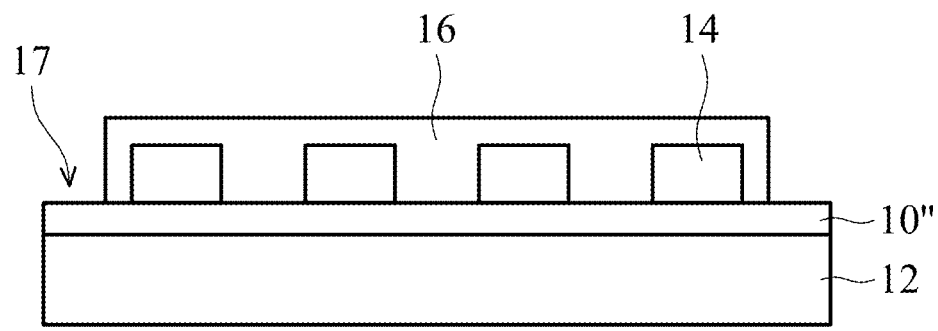

FIG. 1D is a cross-sectional view of a molding process performed on the dies-to-wafer stack. A protection layer 16, such as a molding compound is coated over dies-to-wafer stack and fills the remaining spacing between adjacent dies 14, but leaves an uncovered region 17 at the edge of the thinned wafer 10" for supporting in the molding process. In one embodiment, the uncovered region 17 is a ring of about 2~3 mm at the edge of the thinned wafer 10". The protection layer 16 is formed of a curable material such as, for example a polymer-based material, resin-based material, polyimide, silicon oxide, epoxy, benzocyclobutenes (BCB), Silk™ (Dow Chemical), or a combination thereof. The molding process includes injection molding, compression molding, stencil printing, spin-on coating, or future-developed molding processes. After coating the protection layer 16, a curing or baking step is performed to solidify protection material. In order to avoid damages to the thinned wafer 10" in the subsequent detaching process, a support structure 18 is formed on the uncovered region 17 at the edge of the thinned wafer

Figure 1E:
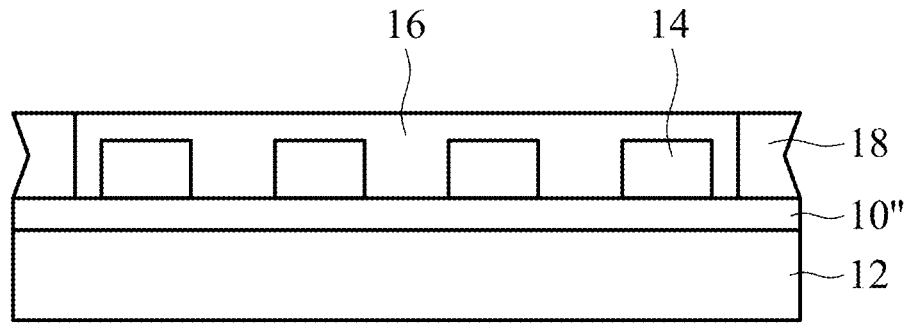

10" as shown in FIG. 1E. The support structure 18 covers at least a portion of the uncovered region 17 to enclose the protection layer 16. In one embodiment, the support layer 18 fills the uncovered region 17 to seal the edge of the thinned wafer 10". The support layer 18 can be formed as the same height of the protection layer 16. The support layer 18 is formed of an adhesive material, or a dielectric material such as, for example a polymer-based material, resin-based material, polyimide, epoxy, spin-on glass (SOG), or a combination thereof by using injection, printing, coating, or future-developed depositing processes.

Figure 1F:
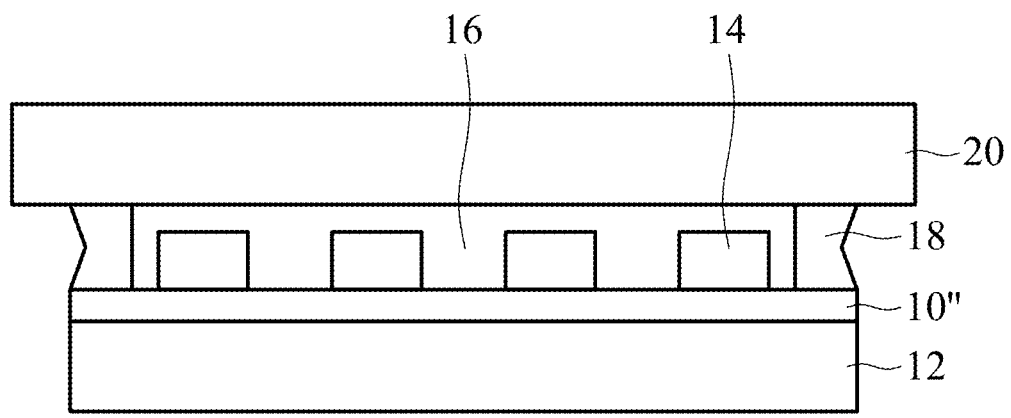

As illustrated in FIG. 1F, typically after wafer-level testing has been completed, a tape 20 is laminated on top of the protection layer 16. The tape 20, for example a BG (Backside Grinding) tape, is formed by coating a UV-curing acrylic resin on polyethylene terephthalate (PET) or polyethylene base member, a resist film made of a polyimide resin (photosensitive or anti-photosensitive), or the like is employed.

Figure 1G:
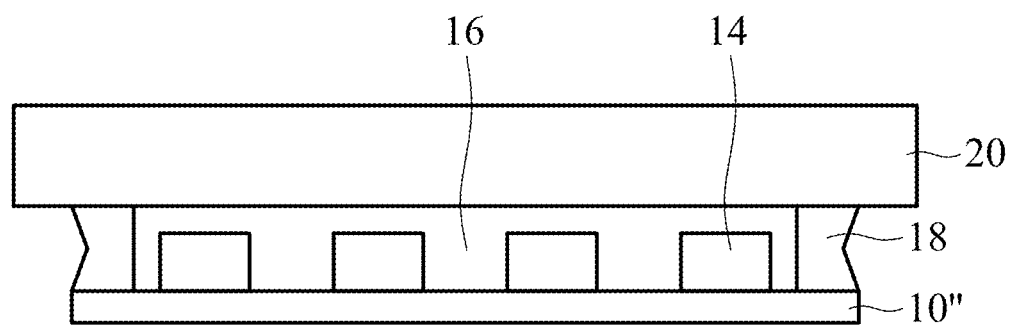

FIG. 1G is a cross-sectional diagram showing the dies-to-wafer stack detached from the carrier 12 to expose the first surface 10*a* of the thinned wafer 10". The detaching process is performed for example by using a solvent, by using UV irradiation or by being pulled off. The use of a solvent or chemical stripper can dissolve the adhesive to allow a disassembly of the wafer-carrier stack. Further, external contacts (e.g., solder bumps, copper-containing bumps or combinations thereof) of the individual semiconductor chips can be formed on the first surface 10*a* of the thinned wafer 10" for bonding to electrical terminals, where it is then diced in the usual manner along cutting lines to separate the encapsulated dies-to-wafer stack into individual semiconductor packages. After dicing, the stacked chip or chips are mounted on an IC card through, for example, an anisotropically conductive connection film.

Cross-sectional diagrams of FIG. 3A to FIG. 3G illustrate an exemplary embodiment of a wafer edge pretreatment for handling a thin wafer. Explanation of the same or similar portions to the description in FIG. 1A to FIG. 1G and FIG. 2A to FIG. 2C is omitted herein.

Figure 3A:
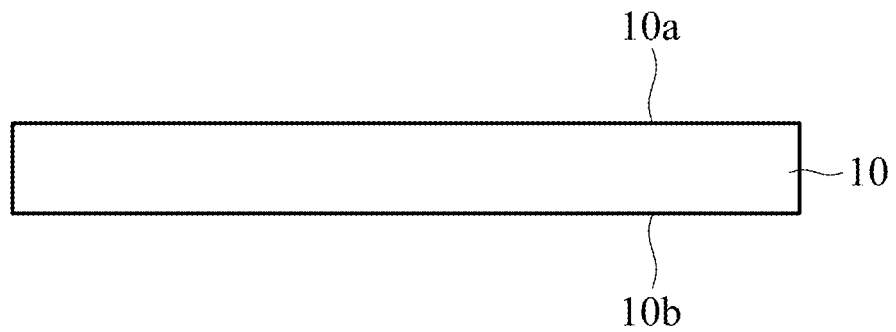
FIGS. 3A to 3G are cross-sectional diagrams illustrating an exemplary embodiment of a wafer edge pretreatment for handling a thin wafer.
Figure 3B:
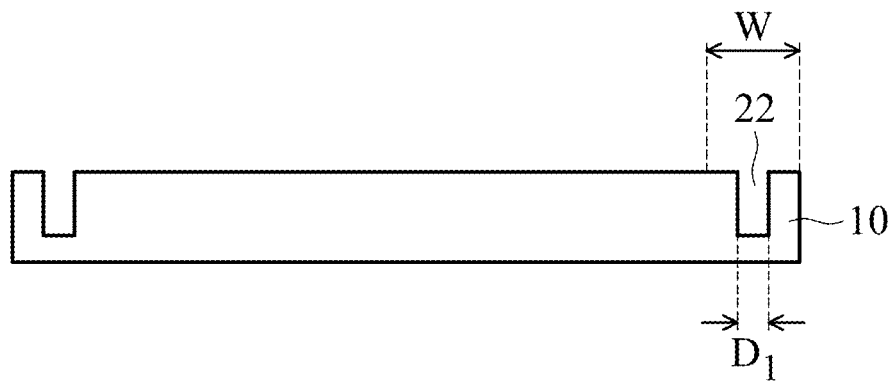
Figure 3C:
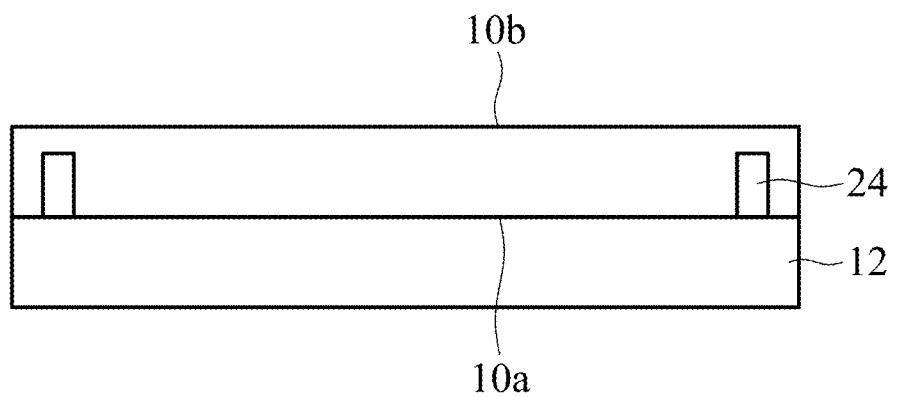

FIG. 3A is a cross-sectional view of one embodiment of a wafer 10 provided with a plurality of semiconductor chips therein. The wafer 10 has a first surface 10*a* and a second surface 10*b* opposite top the first surface 10*a*, and integrated circuits are formed on the first surface 10*a* to connect bond pads and/or other interconnection structures. In order to avoid damages induced in the subsequent detaching process, a trench 22 is formed at the edge of the wafer 10 as shown in FIG. 3B, followed by filling a dielectric material, resulting in a support structure 24 as shown in FIG. 3C. A carrier 12 is then bonded to the adhesive material layer applied on the first surface 10*a* for enabling easier handling of the wafer 10 in subsequent thinning process. The trench 22 passes through at least a portion of the edge area of the first surface 10*a* down to a predetermined depth of the semiconductor substrate. The edge area of the wafer 10 has a width W equal to or less than 10 mm defined from the rim of the wafer 10. For example, the width W is about 2-3 mm. The trench 22 has a diameter D1 of more than 0.1 mm. In one embodiment, the trench 22 has a diameter D1 of about 1-2 mm formed within the edge area. The trench 22 extends to the semiconductor substrate and is, for example, more than 50 mm in depth. In one embodiment, the trench 22 is a ring-shaped opening adjacent to the rim of the wafer 10. The dielectric material of the support structure 24 is formed of, for example, a polymer-based material, resin-based material, polyimide, epoxy, SOG, or a combination thereof.

Figure 3D:
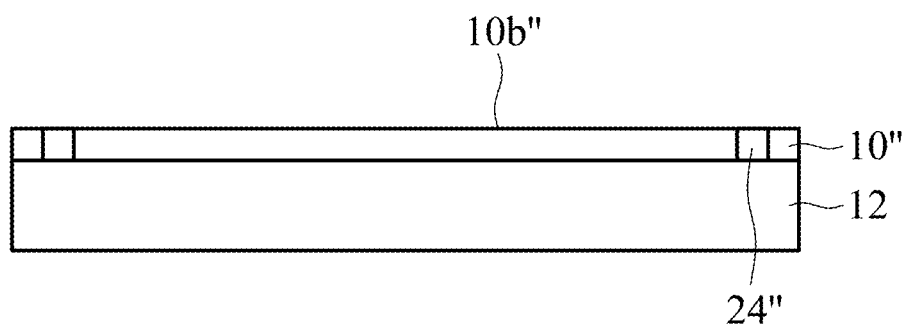
Figure 3E:
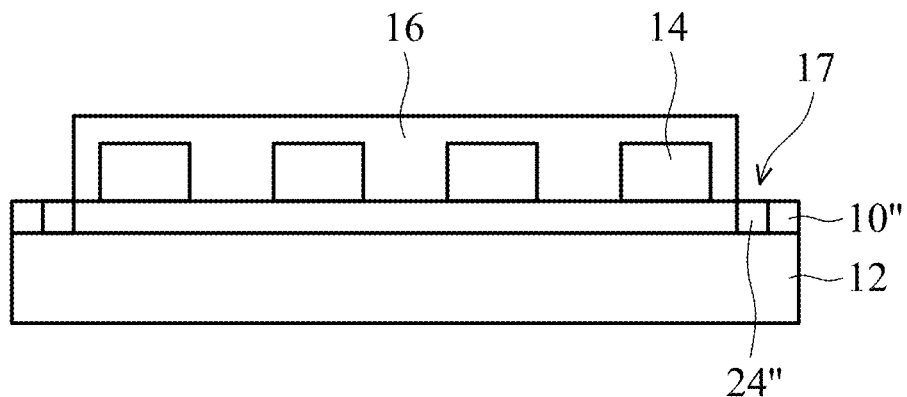
Figure 3F:
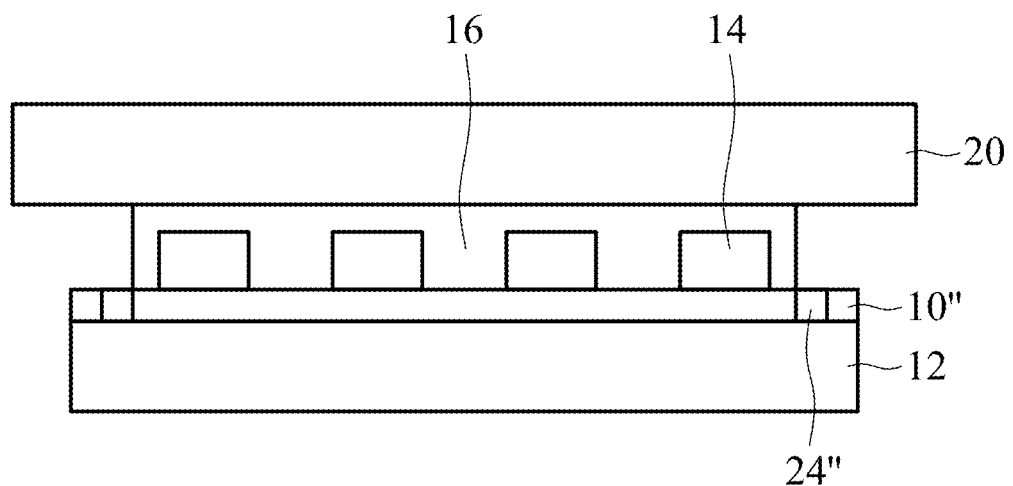
Figure 3G:
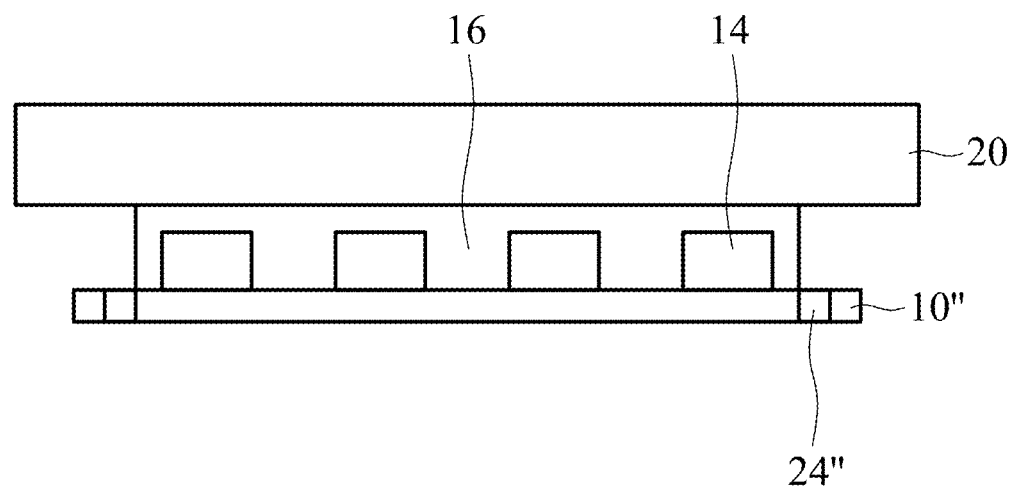

After being attached to the carrier 12, a wafer thinning process is performed on the second surface 10b of the wafer 10 to reach a desired thickness as shown in FIG. 3D, wherein the support structure 24" is also thinned down to be exposed. Thereafter, a plurality of dies 14 are bonded onto the thinned wafer 10" and a protection layer 16 is formed on the dies-to-wafer stack in a molding process as depicted in FIG. 3E. This leaves an uncovered region 17 at the edge area of the thinned wafer 10" for supporting in the molding process. The uncovered region 17 exposes at least a part of the support structure 24". In one embodiment, the protection layer 16 does not cover the support structure 24". In one embodiment, the protection layer 16 covers a part of the support structure 24". The above-described wafer edge pretreatment can be applied for handling a wafer 10 including through vias 40 as depicted in FIGS. 2A to 2C.

Figure 4A:
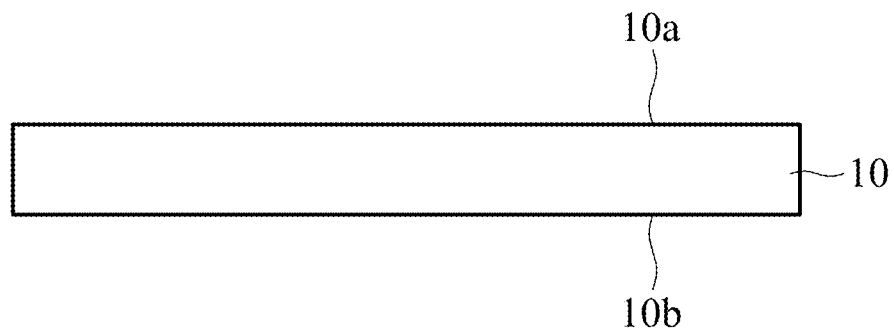
FIGS. 4A to 4G are cross-sectional diagrams illustrating another exemplary embodiment of a wafer edge pretreatment for handling a thin wafer.
Figure 4B:
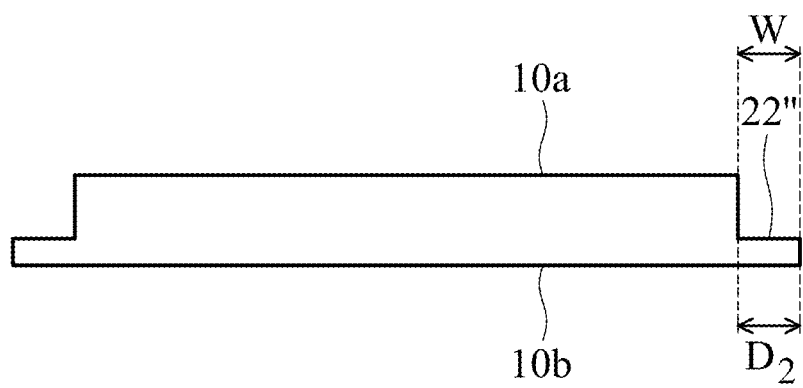
Figure 4C:
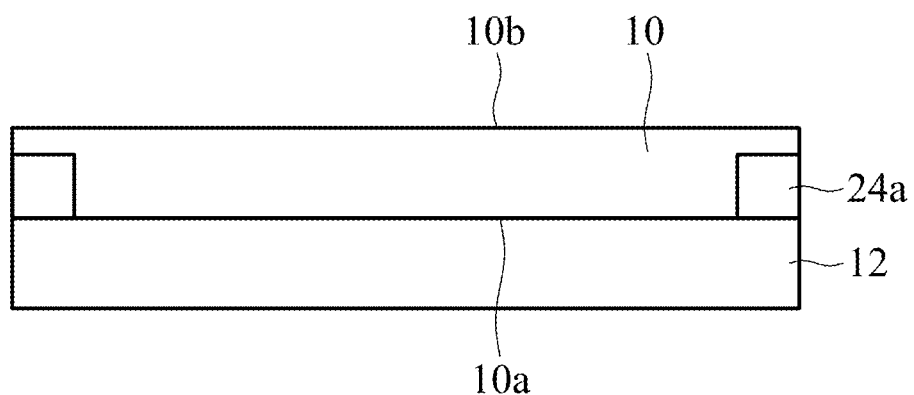
Figure 4D:
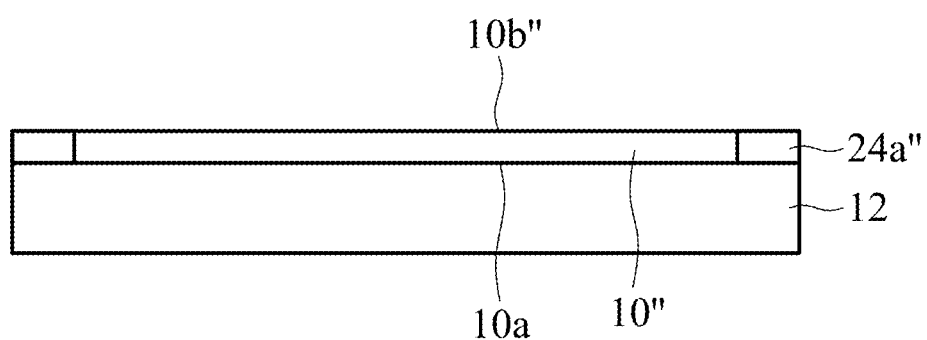
Figure 4E:
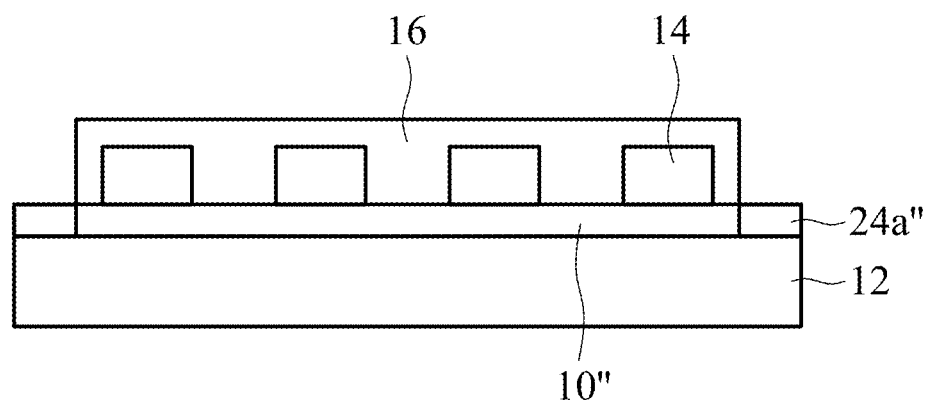
Figure 4F:
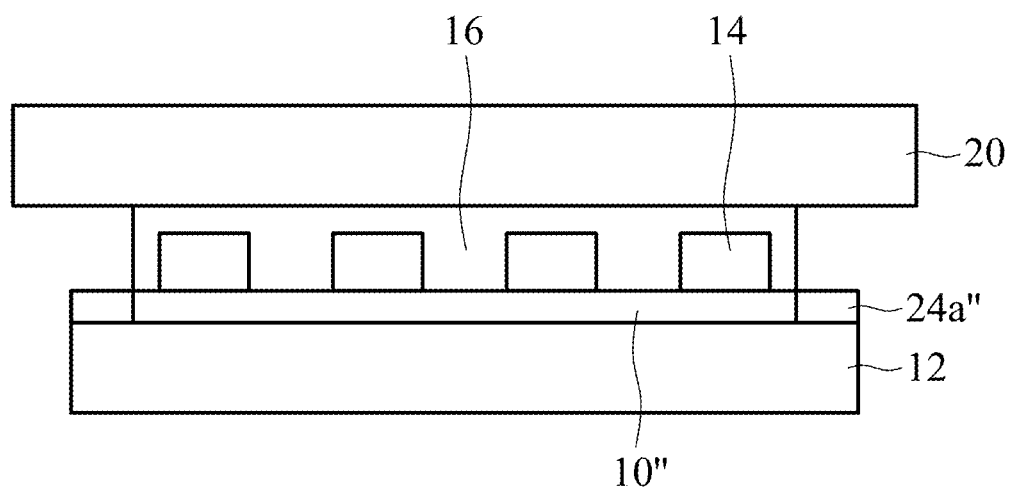
Figure 4G:
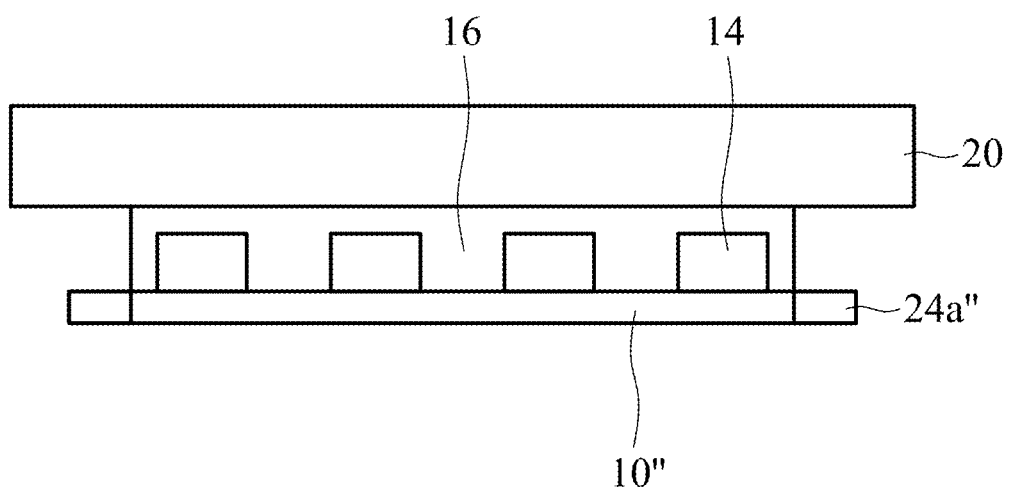

Cross-sectional diagrams of FIGS. 4A to 4G illustrate another exemplary embodiment of a wafer edge pretreatment for handling a thin wafer. Explanation of the same or similar portions to the description in FIGS. 3A to 3G is omitted herein. By comparison, a trench 22" formed at the edge portion of the wafer 10 as shown in FIG. 4B has a diameter D2 substantially equal to the width W of the edge area of the first surface 10a. In one embodiment, the trench 22" has a diameter D2 of about 2-3 mm. After filling the trench 22" with a dielectric material, a support structure 24a is formed at the edge of the wafer 10. In the subsequent wafer thinning process, the support structure 24a is also thinned down and exposed, forming a ring at the rim of the exposed surface 10b" of the thinned wafer 10" as shown in FIG. 4D. In the molding process, the protection layer 16 is coated over the dies-to-wafer stack and fills the remaining spacing between adjacent dies 14, but leaves an uncovered region 17 at the edge area of the thinned wafer 10" for supporting in the molding process. The uncovered region 17 exposes at least a part of the support structure 24a". In one embodiment, the protection layer 16 does not cover the support structure 24a". In one embodiment, the protection layer 16 covers a part of the support structure 24a".

Figure 5A:
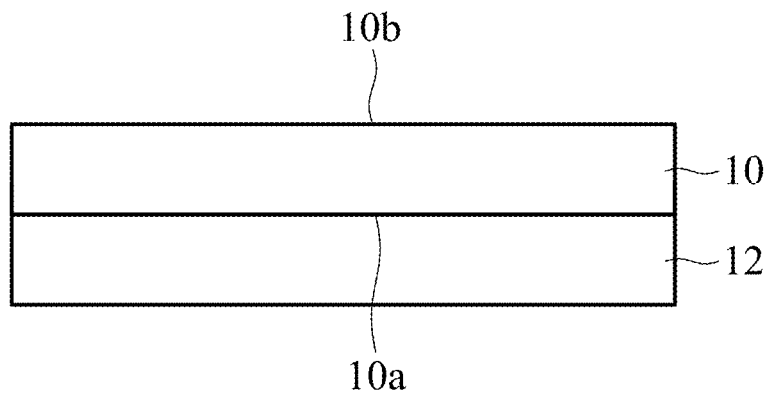
FIGS. 5A to 5E are cross-sectional diagrams illustrating an exemplary embodiment of an edge protection method for handling a thin wafer.
Figure 5B:
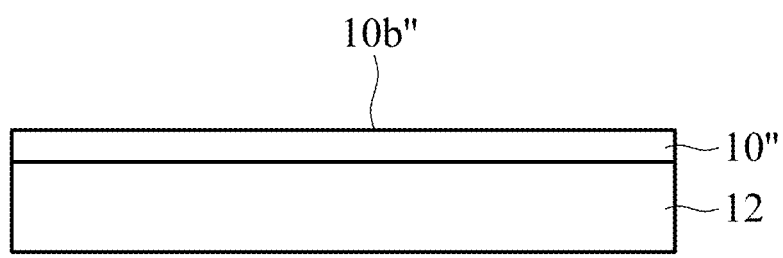
Figure 5C:
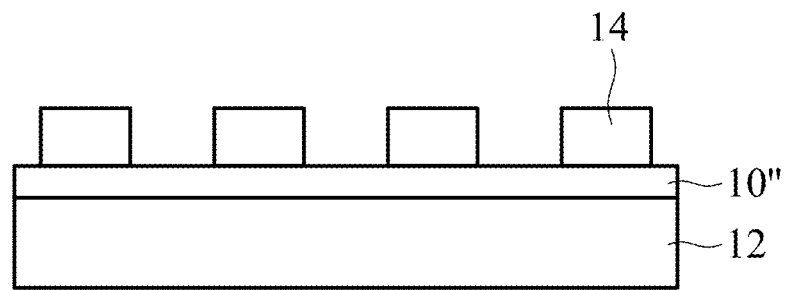
Figure 5D:
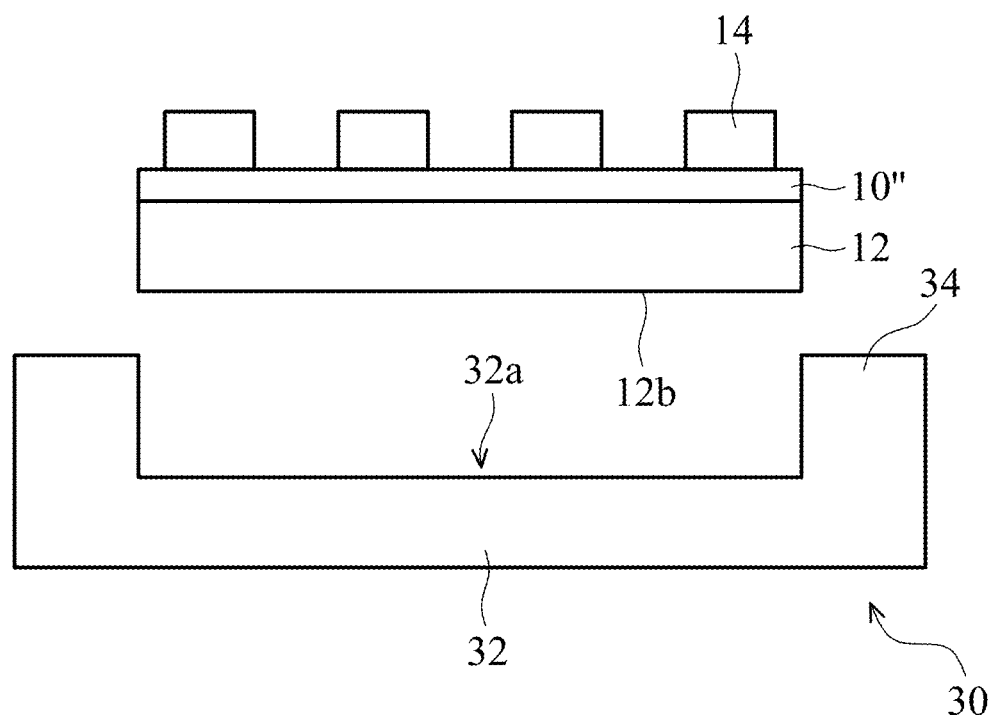
Figure 5E:
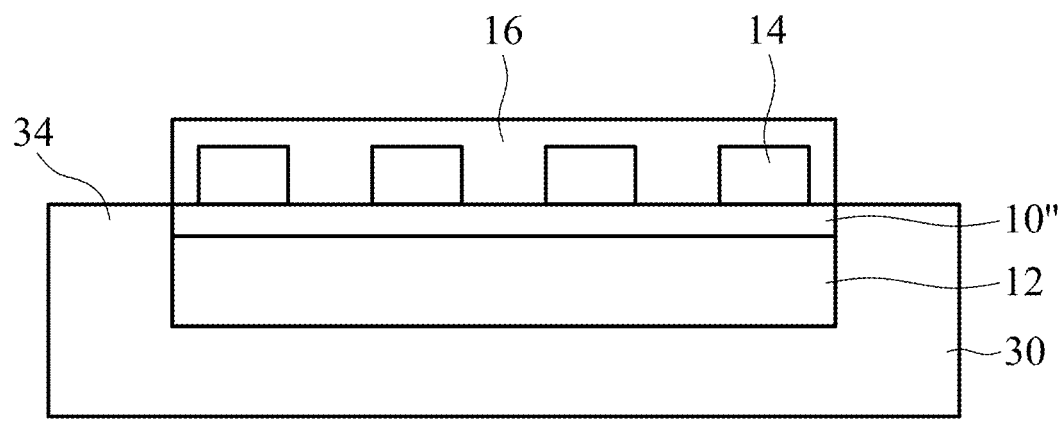

Cross-sectional diagrams of FIGS. 5A to 5E illustrate an exemplary embodiment of an edge protection method for handling a thin wafer. Explanation of the same or similar portions to the description in FIGS. 1A to 1G is omitted herein. By comparison, after forming the dies-to-wafer stack, a housing 30 is provided for supporting the subsequent molding process as shown in FIG. 5D. The housing 30 includes a bottom portion 32 from which a peripheral wall portion 34 extends upwardly to define the concave portion 32a. The dies-to-wafer stack is affixed to the housing 30 by attaching the bottom 12b of the carrier 12 to the bottom portion 32 using gluing or taping. In one embodiment, the concave portion 32a has a planar bottom of an area substantially equal to the bottom area of the carrier 12, thus the rim of the thinned wafer 10" is affixed to the peripheral wall portion 34. The housing 30 may be a rigid or a flexible member made from copper, aluminum, plastic, rubber, paper, cardboard, etc. Thereafter, a molding process is performed on the dies-to-wafer stack supported by the housing 30 as depicted in FIG. 5E, in which a protection layer 16 can cover the edge of the thinned wafer 10" without leaving an uncovered region because the peripheral wall portion 34 serves as a support structure for handling the thinned wafer in the molding process and the carrier-detaching process as well.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method, comprising:
   providing a wafer having a first surface and a second surface opposite to the first surface;
   attaching the first surface of the wafer to a carrier, exposing the second surface of the wafer;
   thinning the wafer from the second surface, forming a thinned wafer;
   bonding a plurality of dies onto the thinned wafer, wherein each die of the plurality of dies having a first surface and a second surface, and the first surface of each die is substantially coplanar;
   encapsulating the thinned wafer and an entirety of surfaces of the dies with a protection layer, the protection layer defining an uncovered region at an edge of the thinned wafer;
   forming a support structure on the uncovered region at the edge of the thinned wafer, wherein
   the support structure fills the uncovered region to cover the edge of the thinned wafer; and
   removing the carrier from the thinned wafer.

2. The method of claim 1, wherein the support structure is a ring enclosing the protection layer.

3. The method of claim 1, wherein the uncovered region has a width ranging from about 2 mm to about 3 mm.

4. The method of claim 1, wherein the support structure is an adhesive material layer.

5. The method of claim 1, wherein the support structure is a polymer-based material, resin-based material, polyimide, epoxy, spin-on glass (SOG), or combinations thereof.

6. The method of claim 1, wherein the protection layer is a polymer-based material formed by a molding process.

7. The method of claim 1, further comprising, before removing the carrier from the thinned wafer, forming a tape on the top of the protection layer, wherein at least one of the protection layer and the support structure is between the tape and the thinned wafer.

8. The method of claim 1, wherein the wafer comprises:
   a semiconductor substrate having a front surface adjacent to the first surface of the wafer and a back surface defining the second surface of the wafer;
   a through via filled with a conductive material passing through at least a part of the semiconductor substrate; and
   integrated circuits formed on the front surface of the semiconductor substrate.

9. The method of claim 8, wherein after thinning the wafer from the second surface, one end of the through via is exposed on the back surface of the semiconductor substrate.

10. The method of claim 9, further comprising, before bonding a plurality of dies onto the thinned wafer, forming a conductive structure on the exposed end of the through via.

11. A method, comprising:
    attaching a wafer to a carrier;
    thinning the wafer to form a thinned wafer;
    bonding a plurality of dies onto the thinned wafer, wherein each die of the plurality of dies has a surface coplanar with a surface of each of the other dies of the plurality of dies;

encapsulating the thinned wafer along with an entirety of surfaces of the plurality of dies with a protection layer; and forming a support structure on an edge of the thinned wafer.

12. The method of claim 11, further comprising removing the carrier wafer from the thinned wafer.

13. The method of claim 12, wherein the protection layer is a polymer-based material, a resin based material, polyimide, silicon oxide, epoxy, silk, or benzocyclobutene (BCB).

14. The method of claim 11, further comprising
forming a through-via on a portion of the wafer;
depositing a conductive material into the through-via; and
forming a conductive structure over the conductive material.

15. The method of claim 11, wherein forming the support structure comprises forming a ring enclosing the protection layer.

16. A method, comprising:
attaching a wafer to a carrier;
thinning the wafer, forming a thinned wafer;
bonding a plurality of dies onto the thinned wafer, wherein each die of the plurality of dies has a surface coplanar with a surface of each of the other dies of the plurality of dies;
encapsulating the thinned wafer along with an entirety of surfaces of each die of the plurality of dies with a protection layer;
forming a support structure on an uncovered region at an edge of the thinned wafer.

17. The method of claim 16, further comprising removing the carrier wafer from the thinned wafer.

18. The method of claim 15, further comprising
forming a through-via on a portion of the wafer;
depositing a conductive material into the through-via; and
forming a conductive structure over the conductive material.

19. The method of claim 16, wherein forming the support structure comprises forming a ring enclosing the protection layer.

20. The method of claim 16, wherein the protection layer is a polymer-based material.

* * * * *